United States Patent
Gardiner et al.

(10) Patent No.: US 9,818,578 B2
(45) Date of Patent: Nov. 14, 2017

(54) DEVICE FOR MONITORING ENVIRONMENTAL STATES OF A MICROSCOPE SAMPLE WITH AN ELECTRON MICROSCOPE SAMPLE HOLDER

(71) Applicant: PROTOCHIPS, INC., Raleigh, NC (US)

(72) Inventors: Daniel Stephen Gardiner, Wake Forest, NC (US); William Bradford Carpenter, Asheville, NC (US); John Damiano, Jr., Apex, NC (US); Franklin Stampley Walden, II, Raleigh, NC (US); David P. Nackashi, Raleigh, NC (US)

(73) Assignee: Protochips, Inc., Morrisville, NC (US)

( * ) Notice: Subject to any disclaimer, the term of this patent is extended or adjusted under 35 U.S.C. 154(b) by 0 days.

(21) Appl. No.: 14/626,234

(22) Filed: Feb. 19, 2015

(65) Prior Publication Data
US 2015/0235805 A1    Aug. 20, 2015

Related U.S. Application Data

(60) Provisional application No. 61/941,743, filed on Feb. 19, 2014.

(51) Int. Cl.
*G01L 7/00* (2006.01)
*G01N 21/03* (2006.01)
(Continued)

(52) U.S. Cl.
CPC ............ *H01J 37/261* (2013.01); *G01K 11/32* (2013.01); *G01L 11/025* (2013.01); *G01L 19/04* (2013.01); *H01J 37/16* (2013.01); *H01J 37/20* (2013.01); *H01J 2237/2001* (2013.01); *H01J 2237/2002* (2013.01); *H01J 2237/2801* (2013.01)

(58) Field of Classification Search
CPC ........ H01J 37/261; H01J 37/26; G01K 11/32; G01K 11/00; G01K 11/3213; G01K 11/3206; G01L 11/025; G01L 11/02; G01L 11/00; G01L 7/00; G01N 21/03
USPC ......... 436/163; 250/428; 374/161, 160, 159; 73/700
See application file for complete search history.

(56) References Cited

U.S. PATENT DOCUMENTS 5,326,971 A * 7/1994 Theodore ............... H01J 37/20
                                                     250/311
6,444,982 B1    9/2002 Mitchell et al.
(Continued)

FOREIGN PATENT DOCUMENTS

| JP | 08031362 A | 1/2013 | |
|---|---|---|---|
| WO | WO 2012/018827 | * 2/2012 | ............ H01J 37/20 |
| WO | WO 2012/018827 A2 * | 2/2012 | ............ H01J 37/20 |

OTHER PUBLICATIONS

International Search Report and Written Opinion for related International Application PCT/US2015/016562 dated May 27, 2015.

*Primary Examiner* — Christine T Mui
(74) *Attorney, Agent, or Firm* — NK Patent Law, PLLC

(57) ABSTRACT

An apparatus and a method for measuring and monitoring the properties of a fluid, for example, pressure, temperature, and chemical properties, within a sample holder for an electron microscope. The apparatus includes at least one fiber optic sensor used for measuring temperature and/or pressure and/or pH positioned in proximity of the sample.

20 Claims, 8 Drawing Sheets

(51) Int. Cl.
*G01K 11/32* (2006.01)
*H01J 37/26* (2006.01)
*H01J 37/16* (2006.01)
*G01L 11/02* (2006.01)
*H01J 37/20* (2006.01)
*G01L 19/04* (2006.01)

(56) References Cited

U.S. PATENT DOCUMENTS

| | | | |
|---|---|---|---|
| 8,878,144 B2 * | 11/2014 | Yaguchi | H01J 37/20 250/440.11 |
| 2012/0025103 A1 | 2/2012 | Deshmukh et al. | |
| 2013/0009071 A1 | 1/2013 | Chen et al. | |
| 2014/0030753 A1 | 1/2014 | Othman et al. | |
| 2014/0034829 A1 * | 2/2014 | Crozier | H01J 37/226 250/307 |

* cited by examiner

Closed cell shown with cover on

Closed cell shown with cover off

Closed cell shown without large MEMS chip

Closed cell shown without small MEMS chip

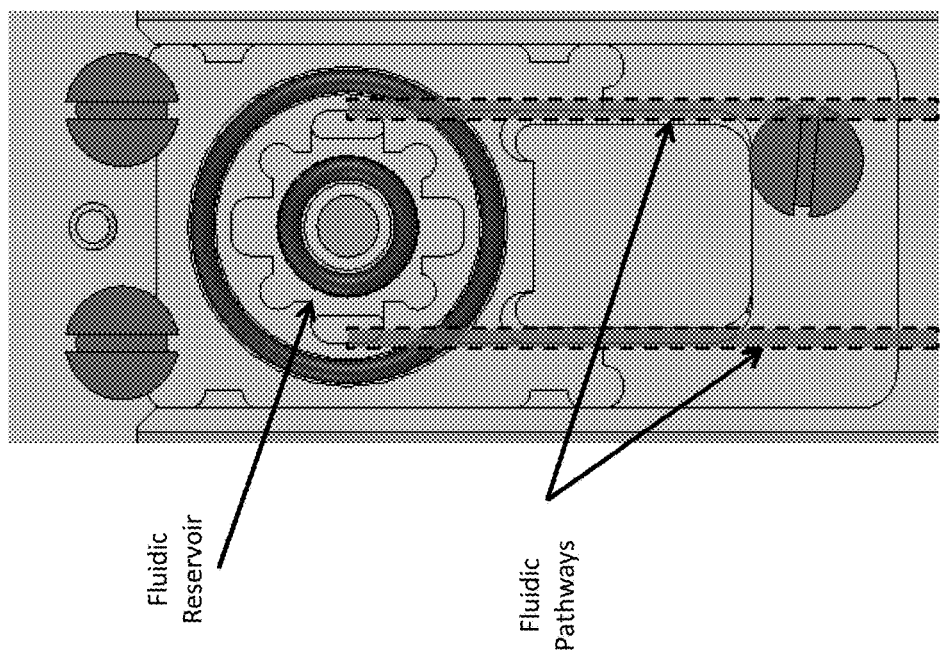

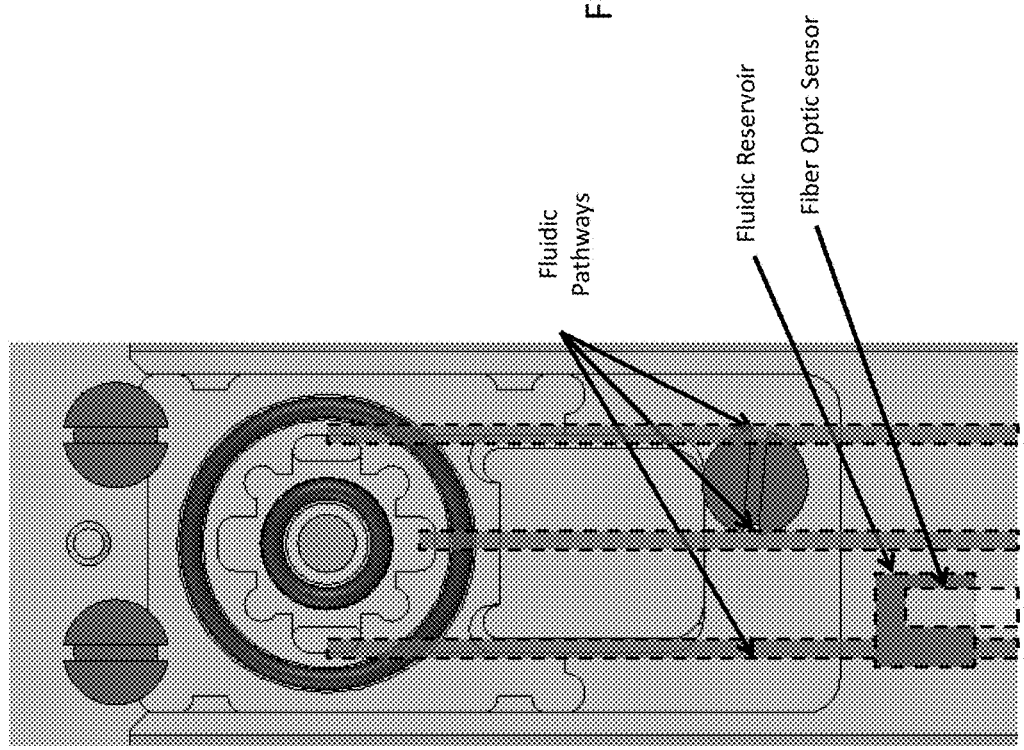

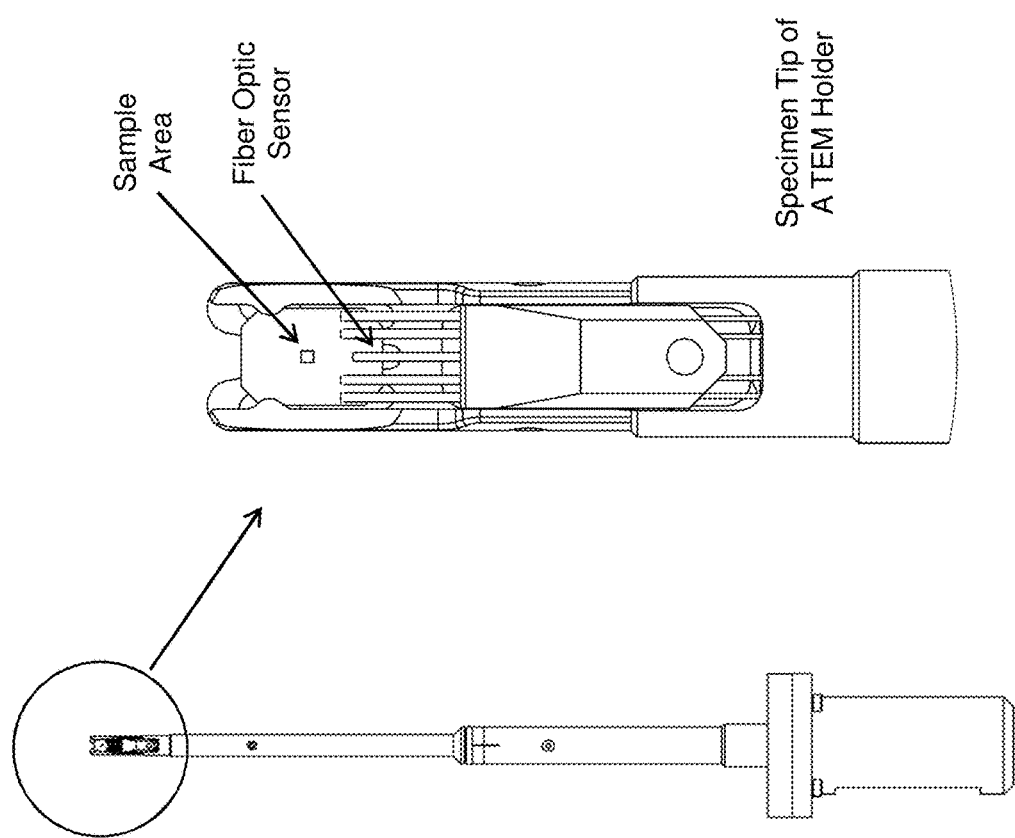

DEVICE FOR MONITORING ENVIRONMENTAL STATES OF A MICROSCOPE SAMPLE WITH AN ELECTRON MICROSCOPE SAMPLE HOLDER

CROSS-REFERENCE TO RELATED APPLICATIONS

This application is filed under the provisions of 35 U.S.C. §111(a) and claims priority to U.S. Provisional Patent Application No. 61/941,743 filed on Feb. 19, 2014, which is hereby incorporated by reference herein in its entirety.

FIELD

The invention relates generally to a method for measuring and monitoring the properties of a fluid such as a gas or liquid within a sample holder for an electron microscope. e.g., a transmission electron microscope (TEM), a scanning transmission electron microscopy (STEM), and variations of the scanning electron microscopes (SEM) that use traditional TEM-type holders and stages, for imaging and analysis.

BACKGROUND

The sample holder is a component of an electron microscope providing the physical support for samples under observation. Sample holders traditionally used for TEMs and STEMs, as well as some modern SEMs, consist of a rod that is comprised of three key regions: the end, the barrel and the specimen tip. In addition to supporting the sample, the sample holder provides an interface between the inside of the instrument (i.e., a vacuum environment) and the outside world.

To use the sample holder, one or more samples are first placed on a sample support device. The sample support device is then mechanically fixed in place at the specimen tip, and the sample holder is inserted into the electron microscope through a load-lock. During insertion, the sample holder is pushed into the electron microscope, assisted by the vacuum within the microscope, until it stops, which results in the specimen tip of the sample holder being located in the column of the microscope. At this point, the barrel of the sample holder bridges the space between the inside of the microscope and the outside of the load lock, and the end of the sample holder is outside the microscope. To maintain an ultra-high vacuum environment inside the electron microscope, flexible o-rings are typically found along the barrel of the sample holder, and these o-rings seal against the microscope when the sample holder is inserted. The exact shape and size of the sample holder varies with the type and manufacturer of the electron microscope, but each holder contains these three key regions.

The sample holder can also be used to provide stimulus to the sample, and this stimulus can include temperature (e.g., heating or cooling), electricity (e.g., applying a voltage or current), mechanical (e.g., applying stress or strain), gas or liquid (e.g., containing a sample in a specific gaseous or liquid environment), or more than one of these at once. For example, a syringe pump can be used to force liquids through a sample holder containing a sample during imaging. This equipment is outside of the microscope, and various connectors are used to bring this stimulus down the length of the holder to the sample holder, and to the samples. For example, microfluidic tubing can be used to supply liquids from the syringe pump to the sample.

One configuration is an environmental cell wherein two semiconductor devices comprising thin windows are used, and samples are sandwiched between the two semiconductor devices, and the environment in proximity of the sample, including an electrical field, temperature, and a gas or liquid flow, can be precisely controlled. The present inventors previously described apparatuses and methods to contact and align devices used to form liquid or gas cells in International Patent Application No. PCT/US2011/46282 filed on Aug. 2, 2011 entitled "ELECTRON MICROSCOPE SAMPLE HOLDER FOR FORMING A GAS OR LIQUID CELL WITH TWO SEMICONDUCTOR DEVICES," which is hereby incorporated herein in its entirety.

It is advantageous to be able to monitor the conditions of the environment at or near the sample. Conditions of particular interest include temperature, pressure and chemical properties such as pH. Disadvantageously, most traditional sensors for measuring such conditions are too large to incorporate into the relatively small spaces of an electron microscope holder. Although some traditional sensors will allow for the measurements farther away from the sample, this limits the ability to ensure high accuracy and dynamic control. A sensor mounted very close to the sample of the holder is needed. One technology that could allow for localized measurements of environmental properties in small areas is fiber optic sensors. Since some of these sensors are available in diameters less than 150 micrometers, they are small enough to overcome previous challenges and by using a delicate balance of design features and parameters, there are a variety of unique ways these sensors can be assembled into the holders.

Fiber optic sensors operate by transporting light by wavelength or intensity to provide information about the environment surrounding the sensor. The environment surrounding a fiber optic sensor is usually liquid or gas. Fiber optic sensors can be categorized as intrinsic or extrinsic. Extrinsic fiber optic sensors simply use an optical fiber to transport light. An example is the laser induced fluorescence (LIF) cone penetrometer. The optical fiber is only a conduit for the laser induced fluorescence to be transported to an uphole detector. In contrast, intrinsic fiber optic sensors use the fiber directly as the detector.

There are a variety of intrinsic fiber optic sensors that could be used to measure environmental properties at the tip of an environmental TEM holder. These include pressure, temperature and chemical fiber optic sensors.

There are specific advantages to measuring temperature of the gas or liquid environment. One primary advantage is accuracy. By monitoring the temperature of the gas or liquid within close proximity to the microscope sample, heat transfer losses can be minimized by ensuring that the temperature is readjusted in real time to the precise required temperature, which is particularly important if the heat source is located at a relative distance from the sample. Many experiments require an accurate temperature to conduct a successful experiment. For example, live biological samples will die if the liquid temperature is too high and certain electrochemical reactions require a stable temperature.

Measuring the absolute pressure of the gas or liquid at the sample offers many advantages as well. One advantage is safety. By monitoring and controlling the pressure, the closed cell system can be kept at a safe level, e.g., avoiding overpressure which can break thin semiconductor membranes and introduce gas into the column of the electron microscope. A second advantage is the ability to calculate the temperature within a gas environment. Since the actual temperature of any given gas or gas mixture is a function of the pressure, and because convective heat transfer of gas can cool heated objects placed in a gaseous environment as a function of pressure, the gas pressure can be measured to accurately calculate the temperature of the heated object. Thirdly, the reaction rate of many reactions is pressure dependent, and the ability to measure and control the pressure is essential to understanding and analyzing experimental results.

Monitoring chemical properties at the sample, such as pH levels in a liquid environmental cell, enable the user to correlate the value of this property in relationship to a reaction(s) observation. It also allows the user or the system to make adjustments to the composition or metering rate of the fluid flowing to the sample region.

It is therefore an object of the present invention to provide a sample holder comprising a sensor or sensors to allow the user to accurately and efficiently measure the environmental properties including pressure, temperature and pH on or within the electron microscope holder in proximity of the sample.

SUMMARY

The present invention generally relates to electron microscope sample holders comprising intrinsic fiber optic pressure, temperature and pH measurement devices, methods for measuring the pressure, temperature and pH in proximity of the sample in the sample holder, and uses of the sample holders.

In one aspect, an electron microscope sample holder is described, said sample holder comprising an end, a barrel, a specimen tip, and at least one fiber optic sensor used for measuring temperature and/or pressure and/or pH, wherein the specimen tip comprises a closed cell comprising a fluidic reservoir, wherein said sensor(s) extends from the end of the sample holder along the barrel to the fluidic reservoir of the closed cell to measure the temperature and/or pressure and/or pH of the fluidic reservoir.

In another aspect, another electron microscope sample holder is described, said sample holder comprising an end, a barrel, a specimen tip, and at least one fiber optic sensor used for measuring temperature and/or pressure, wherein a sample positioned in the specimen tip is exposed to gases and pressures established in an environmental electron microscope, wherein said sensor extends from the end of the sample holder along the barrel to an area at or near the sample.

In still another aspect, a method of measuring the pressure and/or temperature and/or pH in proximity of a sample in a closed cell is described, said method comprising positioning a sample in the fluidic reservoir of the sample holder, and measuring the pressure and/or temperature and/or pH using said sensor(s), wherein the sample holder comprises an end, a barrel, a specimen tip, and at least one fiber optic sensor used for measuring temperature and/or pressure and/or pH, wherein the specimen tip comprises a closed cell comprising a fluidic reservoir, wherein said sensor(s) extends from the end of the sample holder along the barrel to the fluidic reservoir of the closed cell to measure the temperature and/or pressure and/or pH of the fluidic reservoir.

In yet another embodiment, a method of measuring the pressure and/or temperature and/or pH in proximity of a sample in an environmental electron microscope is described, said method comprising positioning a sample in on a sample support device in the sample holder, and measuring the pressure and/or temperature and/or pH using said sensor(s), wherein the sample holder comprises an end, a barrel, a specimen tip, and at least one fiber optic sensor used for measuring temperature and/or pressure, wherein a sample positioned in the specimen tip is exposed to gases and pressures established in an environmental electron microscope, wherein said sensor extends from the end of the sample holder along the barrel to an area at or near the sample.

Other aspects, features and embodiments of the invention will be more fully apparent from the ensuing disclosure and appended claims.

BRIEF DESCRIPTION OF THE DRAWINGS

FIG. 2A is a plan view of an embodiment of the closed sample holder cell with the sample holder cover on.

FIG. 3 is a plan view of the sample holder cell illustrating the placement of the fluidic tubing relative to the fluidic reservoir.

FIG. 7 is a plan view of the sample holder cell illustrating another alternative placement of the fiber optic sensor assembly, wherein the end of the sensor is positioned within a fluidic reservoir along one of the fluidic ports.

FIG. 8 is a plan view of the non-closed sample holder cell illustrating the use of pressure or temperature sensors on non-closed cell electron microscope holders.

DETAILED DESCRIPTION

Figure 1:
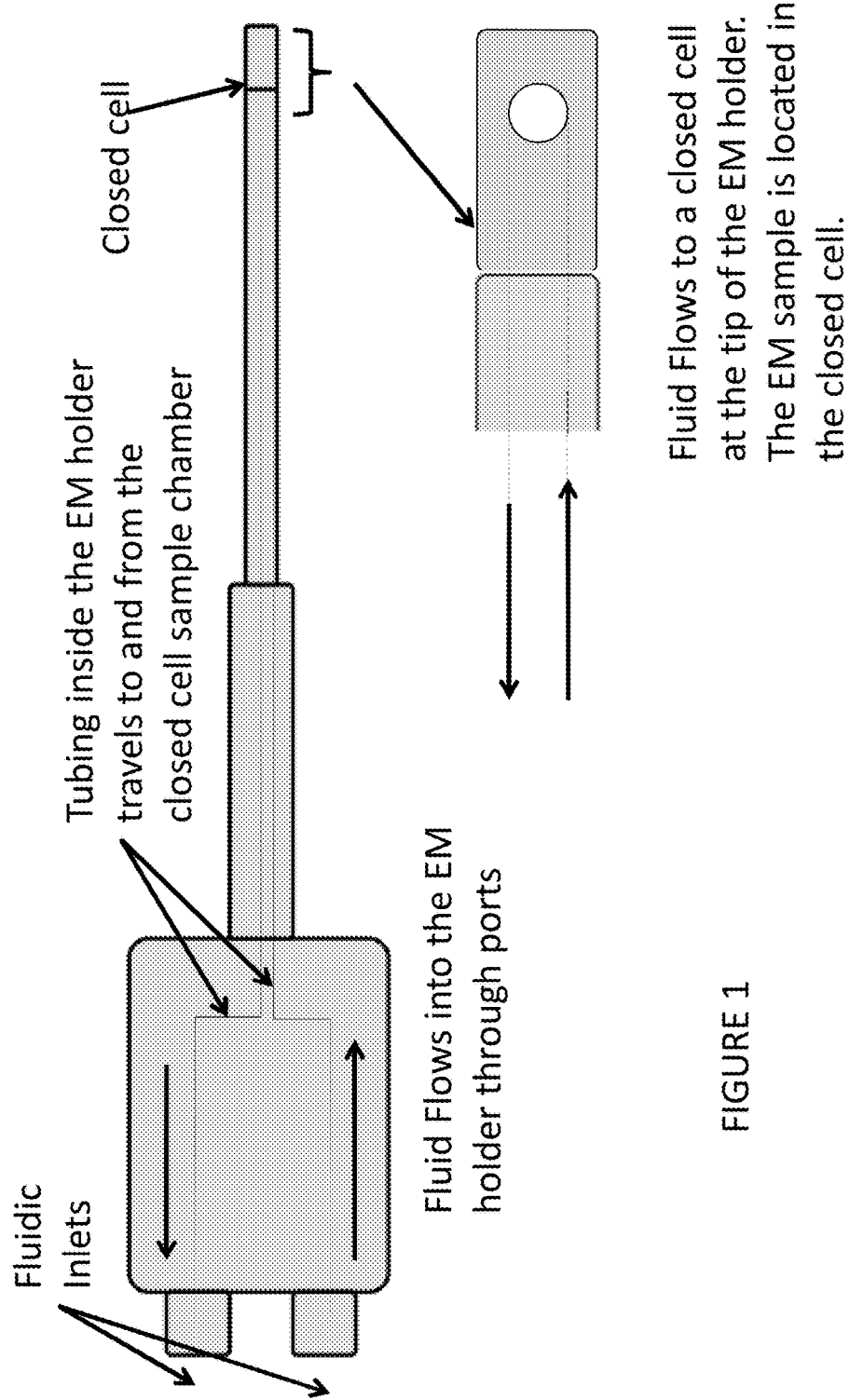
FIG. 1 illustrates the general sample holder described herein.

The present invention generally relates to sample holders comprising intrinsic fiber optic pressure, temperature and pH measurement devices, methods for measuring the pressure, temperature and pH in proximity of the sample in the sample holder, and uses of the sample holders. It is to be understood that the sample holder and sample holder interface described herein are compatible with and may be interfaced with the sample support devices, e.g., semiconductor sample support devices, disclosed in International Patent Application Nos. PCT/US08/63200 filed on May 9, 2008, PCT/US11/46282 filed on Aug. 2, 2011, and PCT/US08/88052 filed on Dec. 22, 2008, which are all incorporated herein by reference in their entireties. It should also be appreciated by one skilled in the art that alternative sample support devices may be interfaced with the sample holder described herein. The sample holder provides mechanical support for one or more samples or sample support devices and may also provide other stimuli (e.g., temperature, electricity, mechanical, chemical, gas or liquid, or any combination thereof) to the samples or sample support devices. The sample holder can be manufactured with tips, barrels and ends of various shapes and sizes such that the sample holder fits any manufacturer's electron microscope.

As used herein, a "sample support device" corresponds to a structure that holds a sample for microscopic imaging. A sample support device can provide an experimental region. Devices may include one, more than one or even an array of experimental regions and may include integrated features such as electrodes, thermocouples, and/or calibration sites, as readily determined by one skilled in the art. One preferred embodiment includes sample support devices made with MEMS technology and with thin membrane regions (continuous or perforated) for supporting a sample in the experimental region. Examples of sample support devices include window devices, thermal devices and electrochemical devices. When the sample holder accommodates two sample support devices, typically one is a window device and one is a thermal device or an electrochemical device.

As defined herein, a "membrane region" on the sample support device corresponds to unsupported material comprising, consisting of, or consisting essentially of carbon, silicon nitride, SiC or other thin films generally 1 micron or less having a low tensile stress (<500 MPa), and providing a region at least partially electron transparent region for supporting the at least one sample. The membrane region may include holes or be hole-free. The membrane region may be comprised of a single material or a layer of more than one material and may be either uniformly flat or contain regions with varying thicknesses. The membrane region is generally supported by a thicker frame.

The general area of "in situ" electron microscopy involves applying stimulus to a sample during imaging. The stimulus could be thermal (heating or cooling), electrical (applying a voltage or current), mechanical (applying stress or strain), chemical (containing a sample in a specific chemical environment), or several of these at once.

The sample holder of the present disclosure is broadly illustrated in FIG. 1, wherein the sample holder includes tubing inside the electron microscope (EM) holder that travels to and from the closed cell at the specimen tip. The placement of the tubing is just for general illustration and is not intended to limit the holder in any way. The tubing permits fluids, e.g., gases or liquids, to travel to the closed cell, for in situ analysis of the sample positioned in the closed cell.

Figure 2A:
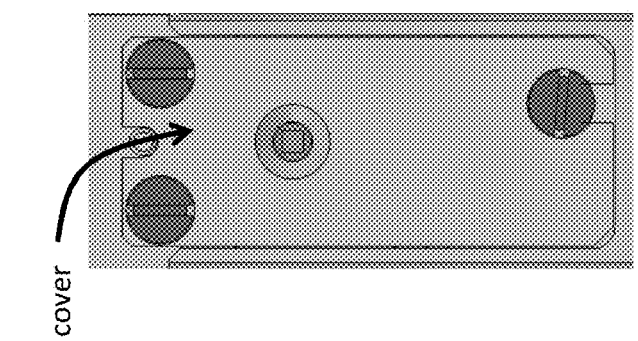
Figure 2B:
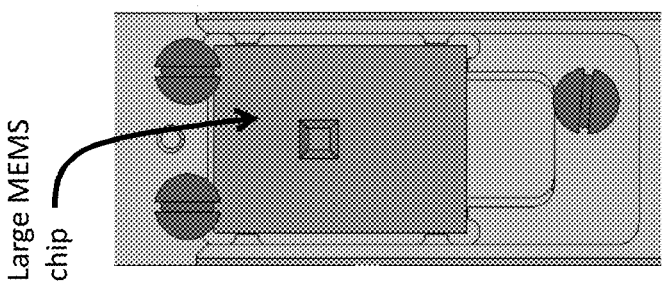
FIG. 2B is a plan view of the sample holder cell of FIG. 2A with the sample holder cover off.
Figure 2C:
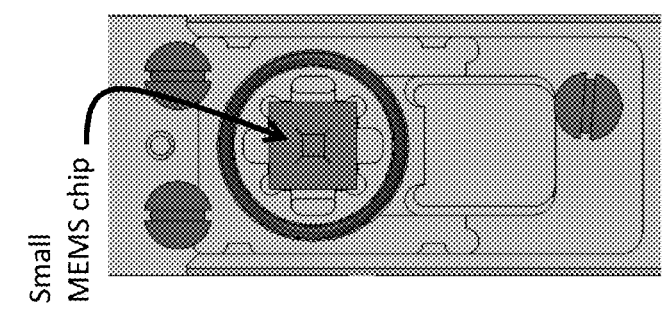
FIG. 2C is a plan view of the sample holder cell of FIG. 2B with the large MEMS chip removed.
Figure 2D:
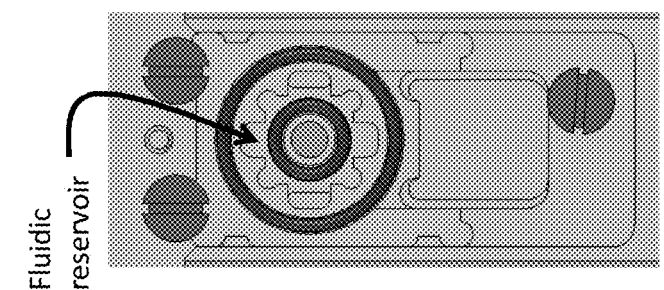
FIG. 2D is a plan view of the sample holder cell of FIG. 2C with the small MEMS chip removed.

FIGS. 2A-2D illustrate an example of the closed cell that is positioned at the specimen tip. The closed cell in FIGS. 2A-2D is just for general illustration and is not intended to limit the closed cell in any way. FIG. 2A is a plan view of a general closed cell, wherein a cover of the closed cell cover is shown positioned and affixed, e.g., with screws, to the cell. FIG. 2B is a plan view of the closed cell with the cover off, revealing the first of two MEMS chips (i.e., a sample support device) positioned in the cell. FIG. 2C is a plan view of the closed cell showing the second of two MEMS chips after the first MEMS chip is removed. The large and small MEMS chips are stacked on top of one another and the sample "sandwiched" between the two chips. FIG. 2C also reveals the first of two O-rings, which is positioned below the large MEMS chip to seal the cell so liquid or gas can be introduced into the cell. FIG. 2D is a plan view of the closed cell showing the bottom of the cell after the second MEMS chip is removed. FIG. 2D also reveals the second of two O-rings, which is positioned below the small MEMS chip to form the second seal so liquid or gas can be introduced into the cell. The fluidic reservoir in FIG. 2D corresponds to the area between the two O-rings when the MEMS chips are in place. Although not illustrated in FIGS. 2A-2D per se, the fluidic reservoir indicated in FIG. 2D has depth to accommodate the large and small MEMS chips. It should be appreciated that the "closed cell" remains in fluid communication with fluidic inlets and hence the closed cell receives fluids from an external source and fluids are returned from the closed cell to an external source.

FIG. 3 illustrates the placement of the fluidic tubing at the fluidic reservoir, wherein the end of the tubing is positioned in the fluidic reservoir.

Figure 4B:
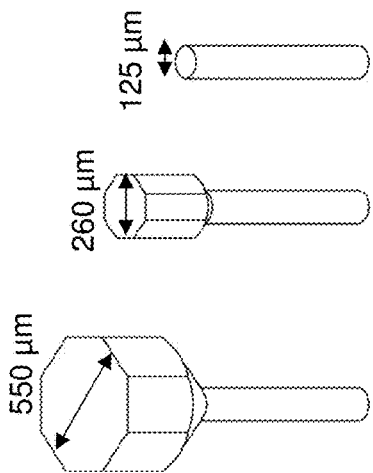
FIG. 4B illustrates examples of the fiber optic sensor assemblies.
Figure 4A:
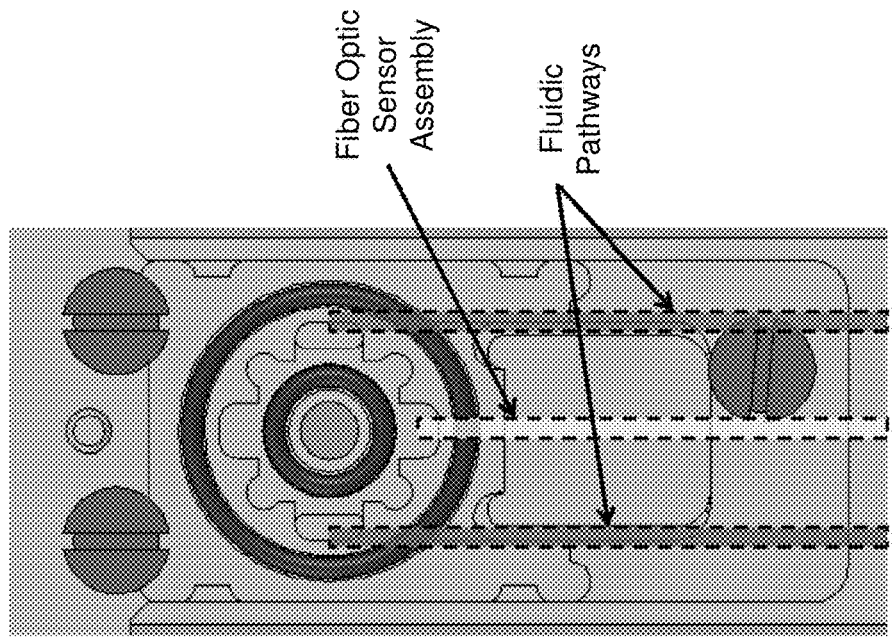
FIG. 4A is a plan view of the sample holder illustrating an embodiment of the placement of the fiber optic sensor assembly.

FIG. 4A illustrates the placement of the fiber optic sensor assembly (i.e., pressure or temperature or chemical assembly) according to a first embodiment of the invention. In FIG. 4A, the end of the sensor is positioned in the fluidic reservoir at or near the sample and sealed. Examples of the fiber optic sensor assemblies are shown in FIG. 4B, e.g., from FISO Technologies, wherein the fiber optic sensor extends through the sample holder and eventually to a control interface.

Mainly three technologies are presently commercially available for pressure measurement with fiber-optic sensors: intensity-based, fiber Bragg gratings and Fabry-Pérot technology. Fabry-Pérot (F-P) technology may be the best compromise in terms of pressure ranges, high sensitivity and miniature size. In F-P pressure sensors, a reflective membrane is assembled above a vacuumed cavity with a semi-reflective layer at the bottom forming a F-P cavity that changes in length with the pressure changes that deflect the membrane. The interference pattern created by the F-P cavity can be used to measure precisely the diaphragm deflection and thus the pressure changes.

For a chemical fiber optic sensor, a portion of the optical fiber cladding is removed and replaced with a chemically selective layer. The sensor is then placed directly into the media to be analyzed. Interaction of the analyte with the chemically selective layer creates a change in absorbance, reflectance, fluorescence, or light polarization. The optical change is then detected by measuring changes in the light characteristic carried by the optical fiber.

Intrinsic temperature sensors with a wide measurement range typically use an interferometric sensing method. These interferometric sensors work by sending a light through a reference fiber and also a sensing fiber. As the temperature changes the physical dimensions of the sensing fiber, there would then be a phase difference in between the light while it travels between the two fibers previously stated. That phase difference can be measured by transforming into a physical dimension change, and lastly it will give the temperature information needed.

Figure 5:
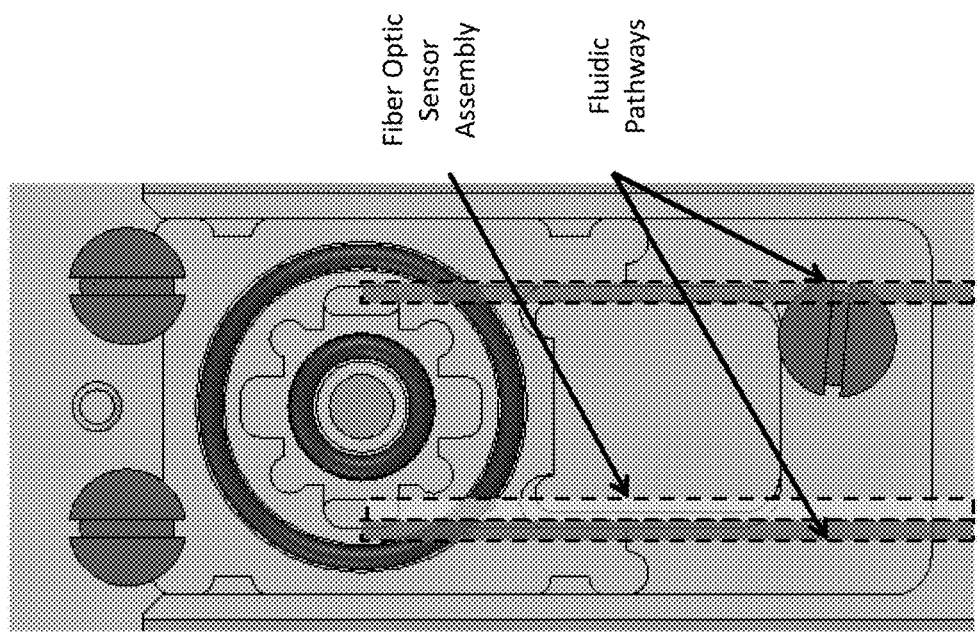
FIG. 5 is a plan view of the sample holder cell illustrating an alternative placement of a pressure or temperature or pH sensor assembly.

FIG. 5 illustrates an alternative placement of a pressure or temperature or pH sensor assembly according to a second embodiment of the invention. In FIG. 5, the end of the sensor is positioned in the fluidic reservoir in proximity to a fluidic ingress or egress and sealed. For example, the sensor can be positioned at the fluidic ingress. Alternatively, the sensor can be positioned at the fluidic egress. An example of the sensor is the fiber optic cable of FIG. 4B, wherein the fiber optic sensor extends through the sample holder and eventually to a control interface.

Figure 6:
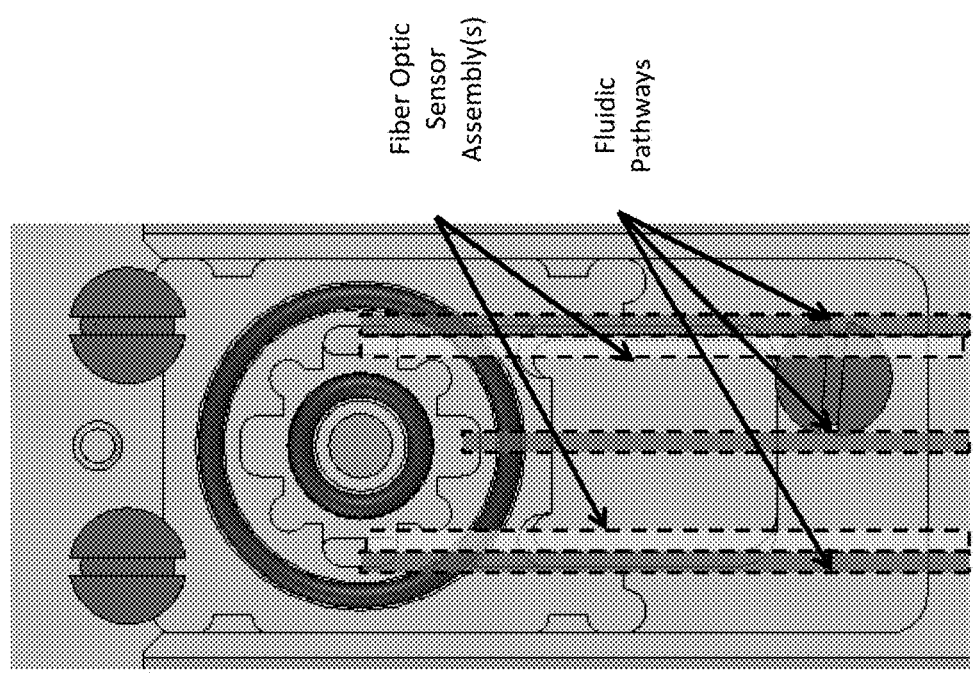
FIG. 6 is a plan view of the sample holder cell illustrating another alternative placement of a pressure or temperature or pH sensor assembly.

FIG. 6 illustrates another alternative placement of the pressure or temperature or pH sensor assembly according to a third embodiment of the invention. In FIG. 6, the end of the sensor is positioned in the fluidic reservoir in proximity to both the fluidic ingress and egress and sealed. An additional fluidic tubing pathway is illustrated as well, although that is optional. Examples of the fiber optic sensor assemblies are shown in FIG. 4B, wherein the fiber optic sensor extends through the sample holder and eventually to a control interface. It should be appreciated that the sensor assembly can include at least one sensor, e.g., a pressure sensor and/or temperature sensor and/or pH sensor, and at least two fluidic ports, arranged either as illustrated herein, but not limited to the embodiments illustrated herein, as appreciated by the person skilled in the art.

FIG. 7 illustrates another alternative placement of the fiber optic sensor assembly according to a fourth embodiment of the invention. In FIG. 7, the end of the sensor is positioned within a fluidic reservoir along one of the fluidic ports. This embodiment provides the ability to utilize larger sensors that may be difficult to place within the confines of the reservoir at the far tip of the holder. Examples of the fiber optic sensor assemblies are shown in FIG. 4B, wherein the fiber optic sensor extends through the sample holder and eventually to a control interface. It should be appreciated that the sensor assembly can include at least one sensor, e.g., a pressure sensor and/or temperature sensor and/or a pH sensor, and at least two fluidic pathways, arranged either as illustrated herein, but not limited to the embodiments illustrated herein, as appreciated by the person skilled in the art. An optional third fluidic pathway is contemplated.

FIG. 8 illustrates the use of pressure or temperature sensors on non-closed cell TEM holders. Electron Microscopes known as ETEMS (Environmental TEMs) establish a small localized gas environment at the sample area that is created by flowing gasses to and from the localized sample area within an Electron Microscope. By placing a fiber optic pressure sensor within the localized gas region, the local pressure can be measured. In the case of a sample heating holder, pressure differences at the sample will change the temperature of the sample. The pressure value can be used by the system to compensate for this. For example, the pressure information could be used by the system to determine an accurate temperature and/or be utilized to create a stable determined temperature by modifying the thermal input to the sample area. Alternatively, a fiber optic temperature sensor can be mounted within the gas region for a direct measurement of the localized temperature.

Regardless of the embodiment, the sample holder described herein permits the user to ensure that the temperature, pressure and/or chemical environment is maintained in real time at the precise required condition.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

The invention claimed is:

1. An electron microscope sample holder comprising:
   a specimen tip defining a cell;
   a sample support assembly for positioning in the cell, the sample support assembly comprising a first sample support device and a second sample support device that covers the first sample support device when the sample support devices are positioned in the cell; and
   a fiber optic sensor assembly comprising a fiber optic cable and a sensor end carried by the fiber optic cable, the sensor end positioned in the cell of the specimen tip, wherein the second sample support device covers the sensor end when the sample support devices are positioned in the cell.

2. The electron microscope sample holder according to claim 1, wherein the second sample support device is larger than the first sample support device such that the second sample support device covers and overhangs beyond the sides of the first sample support device when the sample support devices are positioned in the cell.

3. The electron microscope sample holder according to claim 2, wherein the second sample support device covers and overhangs the sensor end when the sample support devices are positioned in the cell.

4. The electron microscope sample holder according to claim 3, further comprising a first O-ring and a second O-ring, wherein the first sample support device is positioned atop the first O-ring and surrounded by the second O-ring when the sample support devices are positioned in the cell.

5. The electron microscope sample holder according to claim 4, wherein:
   the first O-ring has a first diameter;
   the second O-ring has a second diameter that is greater than the first diameter; and
   when the sample support devices are positioned in the cell, the first O-ring contacts the first sample support device and the second O-ring contacts the second sample support device.

6. The electron microscope sample holder according to claim 5, wherein the sensor end is positioned between the first O-ring and second O-ring.

7. The electron microscope sample holder according to claim 6, wherein:
   the first sample support device has four sides; and
   the second sample support device has four sides each of which overhangs a corresponding one of the four sides of the first sample support device.

8. The electron microscope sample holder according to claim 3, wherein the first sample support device has a first thin membrane region, and the second sample support device has a second thin membrane region aligned with the first thin membrane region when the sample support assembly is positioned in the cell.

9. The electron microscope sample holder according to claim 8, wherein the first sample support device comprises a first MEMS chip, and the wherein the second sample support device comprises a second MEMS chip.

10. The electron microscope sample holder according to claim 8, wherein at least one of the first sample support device and second sample support device comprises a stimulus device.

11. The electron microscope sample holder according to claim 10, wherein the stimulus sample support device is configured to provide at least one of heating, cooling, voltage, electrical current, mechanical stress, and mechanical strain.

12. The electron microscope sample holder according to claim 1, further comprising a barrel on which the specimen tip is mounted, wherein the fiber optic cable extends from the sensor end through the barrel.

13. The electron microscope sample holder of claim 12, wherein at least one fluidic pathway in fluid communication with the cell extends along the barrel.

14. The electron microscope sample holder of claim 13, wherein the at least one fluidic pathway extends to the cell and defines at least one of a fluid ingress and a fluid egress of the cell.

15. The electron microscope sample holder of claim 14, wherein the sensor end of the fiber optic sensor assembly is positioned in the cell proximal to the at least one of a fluid ingress and a fluid egress of the cell.

16. The electron microscope sample holder of claim 12, wherein the electron microscope sample holder further comprises:
   a first fluid pathway extending along the barrel to an ingress of the cell; and
   a second fluid pathway extending along the barrel to an egress of the cell.

17. The electron microscope sample holder of claim 16, wherein the sensor end of the fiber optic sensor assembly is positioned in the cell proximal the ingress of the cell, and wherein the electron microscope sample holder further comprises a second fiber optic sensor assembly comprising:
   a second fiber optic cable and a second sensor end carried by the second fiber optic cable, the second sensor end positioned in the cell of the specimen tip, wherein at least the second sample support device covers the second sensor end when the sample support assembly is positioned in the cell.

18. The electron microscope sample holder of claim 17, wherein the second sensor end is positioned in the cell proximal the egress.

19. The electron microscope sample holder of claim 1, wherein the sensor end of the fiber optic sensor assembly comprises an intrinsic fiber optic sensor.

20. The electron microscope sample holder of claim 1, wherein the fiber optic sensor assembly measures at least one of pressure, temperature, and pH.

* * * * *